United States Patent
Kawakubo (10) Patent No.: US 7,552,369 B2
(45) Date of Patent: Jun. 23, 2009

(54) SEMICONDUCTOR DEVICE AND METHOD FOR TESTING SEMICONDUCTOR DEVICE

(75) Inventor: Tomohiro Kawakubo, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 398 days.

(21) Appl. No.: 11/092,762

(22) Filed: Mar. 30, 2005

(65) Prior Publication Data

US 2006/0092681 A1   May 4, 2006

(30) Foreign Application Priority Data

Oct. 21, 2004   (JP)   ............... 2004-307468

(51) Int. Cl.
*G11C 29/00* (2006.01)
*G11C 7/00* (2006.01)

(52) U.S. Cl. ...................... 714/718; 365/201

(58) Field of Classification Search ......... 714/718–723; 365/200–201
See application file for complete search history.

(56) References Cited

U.S. PATENT DOCUMENTS

| | | | |
|---|---|---|---|
| 4,744,061 A | | 5/1988 | Takemae et al. |
| 5,436,910 A | | 7/1995 | Takeshima et al. |
| 6,009,026 A | * | 12/1999 | Tamlyn et al. ............... 365/201 |
| 6,078,536 A | | 6/2000 | Moon et al. |
| 6,469,327 B1 | * | 10/2002 | Yasuda et al. ............... 257/207 |
| 6,519,726 B1 | | 2/2003 | Shibata |
| 6,530,045 B1 | * | 3/2003 | Cooper et al. ............... 714/719 |
| 6,873,563 B2 | * | 3/2005 | Suwa et al. ............ 365/230.03 |
| 7,136,315 B2 | * | 11/2006 | Kang ......................... 365/201 |
| 2003/0135795 A1 | * | 7/2003 | Weis et al. .................. 714/700 |
| 2003/0160893 A1 | * | 8/2003 | Greenfield et al. ....... 348/419.1 |
| 2003/0214344 A1 | * | 11/2003 | Suwa et al. ................. 327/530 |

FOREIGN PATENT DOCUMENTS

| | | |
|---|---|---|
| EP | 0 143 624 A2 | 6/1985 |
| EP | 0 143 624 A3 | 6/1985 |
| EP | 0 143 624 B1 | 9/1990 |
| JP | 60115099 | 6/1985 |
| JP | 02-015490 | 1/1990 |

(Continued)

OTHER PUBLICATIONS

"Matrix-based test vector decompression using an embedded processor" Balakrishnan et al. This paper appears in: Defect and Fault Tolerance in VLSI Systems, 2002. DFT 2002. Proceedings. 17th IEEE International Symposium on Publication Date: 2002 On pp. 159-165 ISSN: 1063-6722 ISBN: 0-7695-1831-1 INSPEC Accession No. 7604200.*

(Continued)

*Primary Examiner*—Cynthia Britt
(74) *Attorney, Agent, or Firm*—Arent Fox LLP.

(57) ABSTRACT

A semiconductor device includes a memory cell array, in which bit lines intersect word lines to form a memory cell. Representative pads are selected from among pads. Data input to the representative pads is decompressed to data corresponding to all of the pads, and is written in corresponding memory cells. The data is read and divided into number of groups corresponding to number of the representative pads. It is determined whether the data in each group coincide with the data input to the representative pads. Output to the representative pads is controlled based on a result of the determination.

16 Claims, 9 Drawing Sheets

FOREIGN PATENT DOCUMENTS

| | | |
|---|---|---|
| JP | 6203597 | 7/1994 |
| JP | 06-267294 A | 9/1994 |
| JP | 08-107185 | 4/1996 |
| JP | 11-016391 A | 1/1999 |
| JP | 11-052028 A | 2/1999 |
| JP | 11-066899 A | 3/1999 |
| JP | 11176196 | 7/1999 |
| JP | 2000-040397 | 2/2000 |
| JP | 2000040397 A * | 2/2000 |
| JP | 2000-182398 | 6/2000 |
| JP | 2000-182398 A | 6/2000 |
| JP | 2003-007097 | 1/2003 |
| JP | 2003-151299 A | 5/2003 |

OTHER PUBLICATIONS

JP Office Action dated Jan. 27, 2009, 4 pages.

* cited by examiner

| TP | INPUT | | | | DQ## | PATTERNS WRITTEN INSIDE | | | | | | | | | | | | | | |
|----|------|------|------|------|------|----|----|----|----|----|----|----|----|-----|----|----|----|----|----|----|
|    | DQ24 | DQ16 | DQ08 | DQ00 |      | 31 | 30 | 29 | 28 | 27 | 26 | 25 | 24 | ... | 03 | 02 | 01 | 00 |
| 0 | 0 | 0 | 0 | 0 |  | 0 | 0 | 0 | 0 | 0 | 0 | 0 | 0 | ... | 0 | 0 | 0 | 0 |
| 1 | 0 | 0 | 0 | 1 |  | 0 | 0 | 0 | 1 | 0 | 0 | 0 | 1 | ... | 0 | 0 | 0 | 1 |
| 2 | 0 | 0 | 1 | 0 |  | 0 | 0 | 1 | 0 | 0 | 0 | 1 | 0 | ... | 0 | 0 | 1 | 0 |
| 3 | 0 | 0 | 1 | 1 |  | 0 | 0 | 1 | 1 | 0 | 0 | 1 | 1 | ... | 0 | 0 | 1 | 1 |
| 4 | 0 | 1 | 0 | 0 |  | 0 | 1 | 0 | 0 | 0 | 1 | 0 | 0 | ... | 0 | 1 | 0 | 0 |
| 5 | 0 | 1 | 0 | 1 |  | 0 | 1 | 0 | 1 | 0 | 1 | 0 | 1 | ... | 0 | 1 | 0 | 1 |
| 6 | 0 | 1 | 1 | 0 |  | 0 | 1 | 1 | 0 | 0 | 1 | 1 | 0 | ... | 0 | 1 | 1 | 0 |
| 7 | 0 | 1 | 1 | 1 |  | 0 | 1 | 1 | 1 | 0 | 1 | 1 | 1 | ... | 0 | 1 | 1 | 1 |
| 8 | 1 | 0 | 0 | 0 |  | 1 | 0 | 0 | 0 | 1 | 0 | 0 | 0 | ... | 1 | 0 | 0 | 0 |
| 9 | 1 | 0 | 0 | 1 |  | 1 | 0 | 0 | 1 | 1 | 0 | 0 | 1 | ... | 1 | 0 | 0 | 1 |
| A | 1 | 0 | 1 | 0 |  | 1 | 0 | 1 | 0 | 1 | 0 | 1 | 0 | ... | 1 | 0 | 1 | 0 |
| B | 1 | 0 | 1 | 1 |  | 1 | 0 | 1 | 1 | 1 | 0 | 1 | 1 | ... | 1 | 0 | 1 | 1 |
| C | 1 | 1 | 0 | 0 |  | 1 | 1 | 0 | 0 | 1 | 1 | 0 | 0 | ... | 1 | 1 | 0 | 0 |
| D | 1 | 1 | 0 | 1 |  | 1 | 1 | 0 | 1 | 1 | 1 | 0 | 1 | ... | 1 | 1 | 0 | 1 |
| E | 1 | 1 | 1 | 0 |  | 1 | 1 | 1 | 0 | 1 | 1 | 1 | 0 | ... | 1 | 1 | 1 | 0 |
| F | 1 | 1 | 1 | 1 |  | 1 | 1 | 1 | 1 | 1 | 1 | 1 | 1 | ... | 1 | 1 | 1 | 1 |

SEMICONDUCTOR DEVICE AND METHOD FOR TESTING SEMICONDUCTOR DEVICE

CROSS-REFERENCE TO RELATED APPLICATIONS

The present document incorporates by reference the entire contents of Japanese priority document, 2004-307468 filed in Japan on Oct. 21, 2004.

BACKGROUND OF THE INVENTION

1) Field of the Invention

The present invention relates to a semiconductor device and a method for testing the semiconductor device. More specifically, the present invention relates to testing a semiconductor memory device in a DQ-compression test mode.

2) Description of the Related Art

Semiconductor memory devices such as DRAM (dynamic random access memory) typically have 16 or more pads that are used to input and output data. When testing semiconductor memory devices, probe pins of testing devices are brought into contact with such input/output pads. However, as many semiconductor memory devices are usually tested simultaneously, there are not enough probe pins to contact all of the pads. Therefore, a testing method in a DQ compression test (also referred to as I/O compression test or I/O contraction test) mode is employed, so that only about four pads need to contact a probe pin, respectively.

In the DQ-compression testing method, a predetermined test pattern is installed as a DQ-compression test mode code. When the test mode code is input, data is written not only in cells connected to input/output pads that contact the probe pins, but also in cells connected to input/output pads that do not contact the probe pins. Thus, interference between bit lines connected to cells and conditions between storage (capacitor) of cells can be tested.

Figure 9:
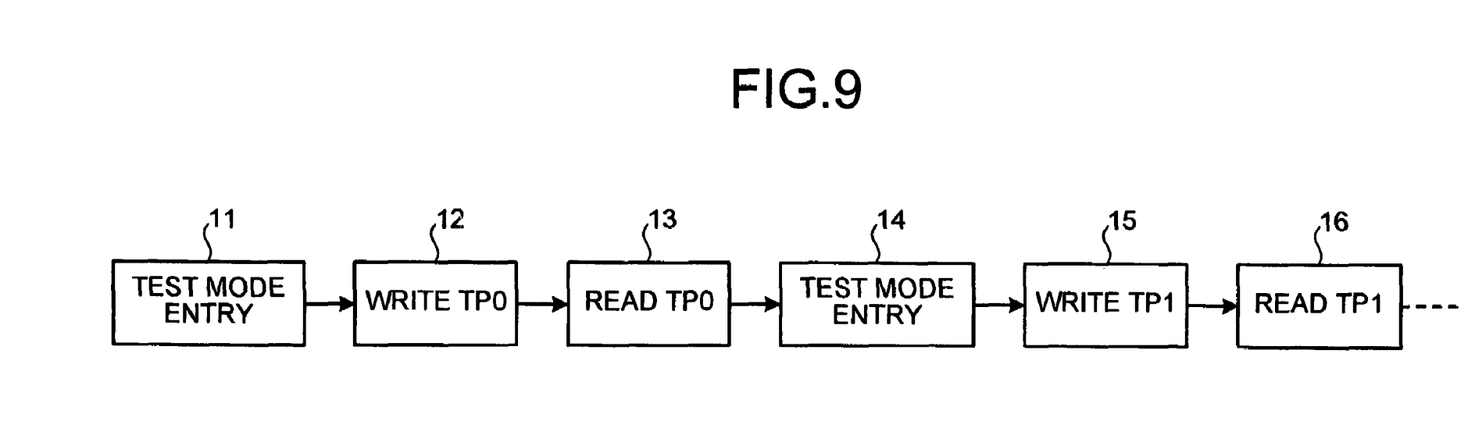
FIG. 9 is a sequence of a testing method in a conventional DQ-compression test mode.

FIG. 9 is a sequence of a testing method in a conventional DQ-compression test mode. Test mode entry 11 is executed to input test pattern-0 (TP0), and data for test pattern-0 (TP0) is written 12 and read 13. Subsequently, test mode entry 14 is executed to input test pattern-1 (TP1), and data for test pattern-1 (TP1) is written 15 and read 16. Although not shown, the same sequence is repeated for test pattern-2 (TP2) onwards.

There are various configurations of semiconductor memory devices to execute tests in the DQ-compression test mode. For example, there is known a semiconductor memory device that includes a selecting unit that selects input terminals for inputting test patterns and a generating unit that generates physical patterns (refer to Japanese Patent Application Laid-Open Publication No. 2000-182398). The selecting unit selects a plurality of line groups from at least either bit lines or word lines. Then, the selecting unit selects whether to input a predetermined test pattern to be used in a specific test for the semiconductor memory device, in the terminal of each selected line group. The generating unit inputs predetermined data in the selected line groups to input the test pattern, outputs predetermined data to data buses connected to the selected line groups, and also outputs predetermined data to data buses of line groups other than the selected line groups.

Another example of such semiconductor memory device includes an I/O compressing unit. The I/O compressing unit writes column address data of an external address of the write operation, as an I/O compression test pattern, in a memory cell of a preselected bank. The I/O compression test pattern simultaneously measures a plurality of multi-bit synchronous DRAMs in the test mode. The I/O compressing unit retains column address data of an external address of the read operation as comparative data, in a retaining unit other than the memory cell. The I/O compressing unit then reads the data from the memory cell and compares it with the comparative data, and outputs the comparison results outside as 1 bit signals (refer to Japanese Patent Application Laid-Open Publication No. 2003-7097). Yet another example of such semiconductor memory device includes an I/O contraction test function capable of writing independent, arbitrary data into a plurality of memory cells selected by one word line and one column selection line. The I/O contraction test function writes independent data into adjacent memory cells. The memory cell into which data is written is different to the memory cell from which data is read (refer to Japanese Patent Application Laid-Open Publication No. 2000-40397).

However, in the conventional DQ-compression test mode, every time a test pattern for bit lines is changed, a test mode entry needs to be executed to input the test code, which leads to increased time and cost.

SUMMARY OF THE INVENTION

It is an object of the present invention to at least solve the problems in the conventional technology.

According to an aspect of the present invention, a semiconductor device includes a memory cell array wherein a plurality of bit lines intersect a plurality of word lines, a memory cell being provided at each intersection of the bit lines and the word lines, and data is written in or read from a memory cell by selecting an appropriate bit line and an appropriate word line. The semiconductor device further includes a plurality of pads to input or output data; a plurality of representative pads selected from among the pads; a decompressing unit that decompresses data input to the representative pads to data corresponding to all of the pads; and a writing unit that writes the data decompressed in corresponding memory cells.

According to another aspect of the present invention, a semiconductor device includes a memory cell array wherein a plurality of bit lines intersect a plurality of word lines, a memory cell being provided at each intersection of the bit lines and the word lines, and data is written in or read from a memory cell by selecting an appropriate bit line and an appropriate word line. The semiconductor device further includes a plurality of pads to input or output data; a plurality of representative pads selected from among the pads; a reading unit that reads data from the memory cells; a determining unit that divides the data read corresponding to all of the pads into number of groups corresponding to number of the representative pads, and determines whether the data in each group coincide with data previously written in the memory cells via the representative pads; and an output control unit that controls output to the representative pads based on a result of determination obtained by the determining unit.

According to still another aspect of the present invention, a semiconductor device includes a memory cell array wherein a plurality of bit lines intersect a plurality of word lines, a memory cell being provided at each intersection of the bit lines and the word lines, and data is written in or read from a memory cell by selecting an appropriate bit line and an appropriate word line. The semiconductor device further includes a plurality of pads to input or output data; a plurality of representative pads selected from among the pads; a decompressing unit that decompresses data input to the representative pads to data corresponding to all of the input/output pads; a writing unit that writes the data decompressed in corresponding memory cells; a reading unit that reads the data from the memory cells written by the writing unit; a determining unit that divides the data read corresponding to all of the pads into number of groups corresponding to number of the representative pads, and determines whether the data in each group coincide with the data previously written in the memory cells via the representative pads; and an output control unit that controls output to the representative pads based on a result of determination obtained by the determining unit.

According to still another aspect of the present invention, a semiconductor device includes a first memory bank and a second memory bank, each of the first memory bank and the second memory bank having a memory cell array that has a plurality of bit lines intersecting a plurality of word lines, and a memory cell provided at each intersection of the bit lines and the word lines, wherein an address data selects a memory bank, an appropriate bit line and an appropriate word line selects a memory cell in the memory bank selected, and the address data is written in or read from the memory cell selected. The semiconductor device further includes a plurality of pads to input or output data; a plurality of representative pads selected from among the pads; a decompressing unit that decompresses data input to the representative pads to data corresponding to all of the pads; a writing unit that writes the data decompressed in corresponding memory cells in both the first memory bank and the second memory bank; a reading unit that reads the data from the memory cells in both the first memory bank and the second memory bank; a first determining unit that divides the data read from the memory cells in the first memory bank corresponding to all of the pads into number of groups corresponding to number of the representative pads, and determines whether the data in each group coincide with the data previously written in the memory cells via the representative pads; a first output control unit that controls output to the representative pads based on a result of determination obtained by the first determining unit; a second determining unit that divides the data read from the memory cells in the second memory bank corresponding to all of the pads into number of groups corresponding to number of the representative pads, and determines whether the data in each group coincide with the data previously written in the memory cells via the representative pads; a second output control unit that controls output to the representative pads, other than the representative pads to which the result of the first determining unit is output, based on a result of determination obtained by the second determining unit.

According to still another aspect of the present invention, a testing method in a DQ-compression test mode for a semiconductor device that includes a memory cell array wherein a plurality of bit lines intersect a plurality of word lines, a memory cell being provided at each intersection of the bit lines and the word lines, and data is written in or read from a memory cell by selecting an appropriate bit line and an appropriate word line. The method includes selecting a plurality of representative pads from among a plurality of pads; decompressing data input to the representative pads to data corresponding to all of the pads; writing the data decompressed in corresponding memory cells; reading the data from the memory cells written at the writing; dividing the data read corresponding to all of the pads into number of groups corresponding to number of the representative pads; determining whether the data in each group coincide with the data previously written in the memory cells via the representative pads; and controlling output to the representative pads based on a result of determination.

According to still another aspect of the present invention, a testing method in a DQ-compression test mode for a semiconductor device that includes a first memory bank and a second memory bank, each of the first memory bank and the second memory bank having a memory cell array that has a plurality of bit lines intersecting a plurality of word lines, and a memory cell provided at each intersection of the bit lines and the word lines, wherein an address data selects a memory bank, an appropriate bit line and an appropriate word line selects a memory cell in the memory bank selected, and the address data is written in or read from the memory cell selected. The method includes selecting a plurality of representative pads from among a plurality of pads; decompressing data input to the representative pads to data corresponding to all of the pads; writing the data decompressed in corresponding memory cells in both the first memory bank and the second memory bank; reading the data from the memory cells in both the first memory bank and the second memory bank; dividing the data read from the memory cells in the first memory bank corresponding to all of the pads into number of groups corresponding to number of the representative pads; determining whether the data in each group in the first memory bank coincide with the data previously written in the memory cells via the representative pads; dividing the data read from the memory cells in the second memory bank corresponding to all of the pads into number of groups corresponding to number of the representative pads; determining whether the data in each group in the second memory bank coincide with the data previously written in the memory cells via the representative pads; controlling output to the representative pads based on a result of determination for the first memory bank; and controlling output to the representative pads, other than the representative pads to which the result for the first memory bank is output, based on a result of determination for the second memory bank.

The other objects, features, and advantages of the present invention are specifically set forth in or will become apparent from the following detailed description of the invention when read in conjunction with the accompanying drawings.

DETAILED DESCRIPTION

Exemplary embodiments of the present invention will be described below with reference to accompanying drawings.

Figure 1:
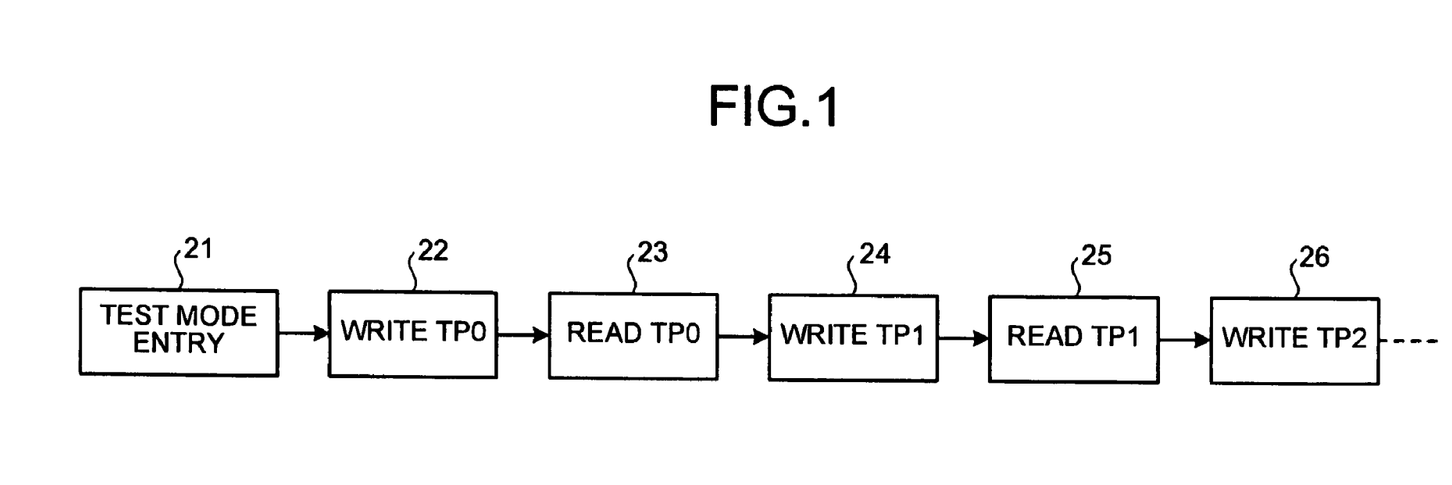
FIG. 1 is a sequence of a testing method in a DQ compression test mode according to an embodiment of the present invention.

FIG. 1 is a sequence of a testing method according an embodiment of the present invention. Test mode entry 21 is executed so that data for test pattern-0 (TP0) is written 22 and read 23. When reading 23 is completed, data for test pattern-1 (TP1) is written 24 and read 25. Subsequently, data for test pattern-2 (TP2) is written 26 and read. The same sequence is repeated for test pattern-3 onwards (not shown). As explained above, the test patterns can be changed consecutively without executing a test mode entry for each test pattern.

Figure 2:
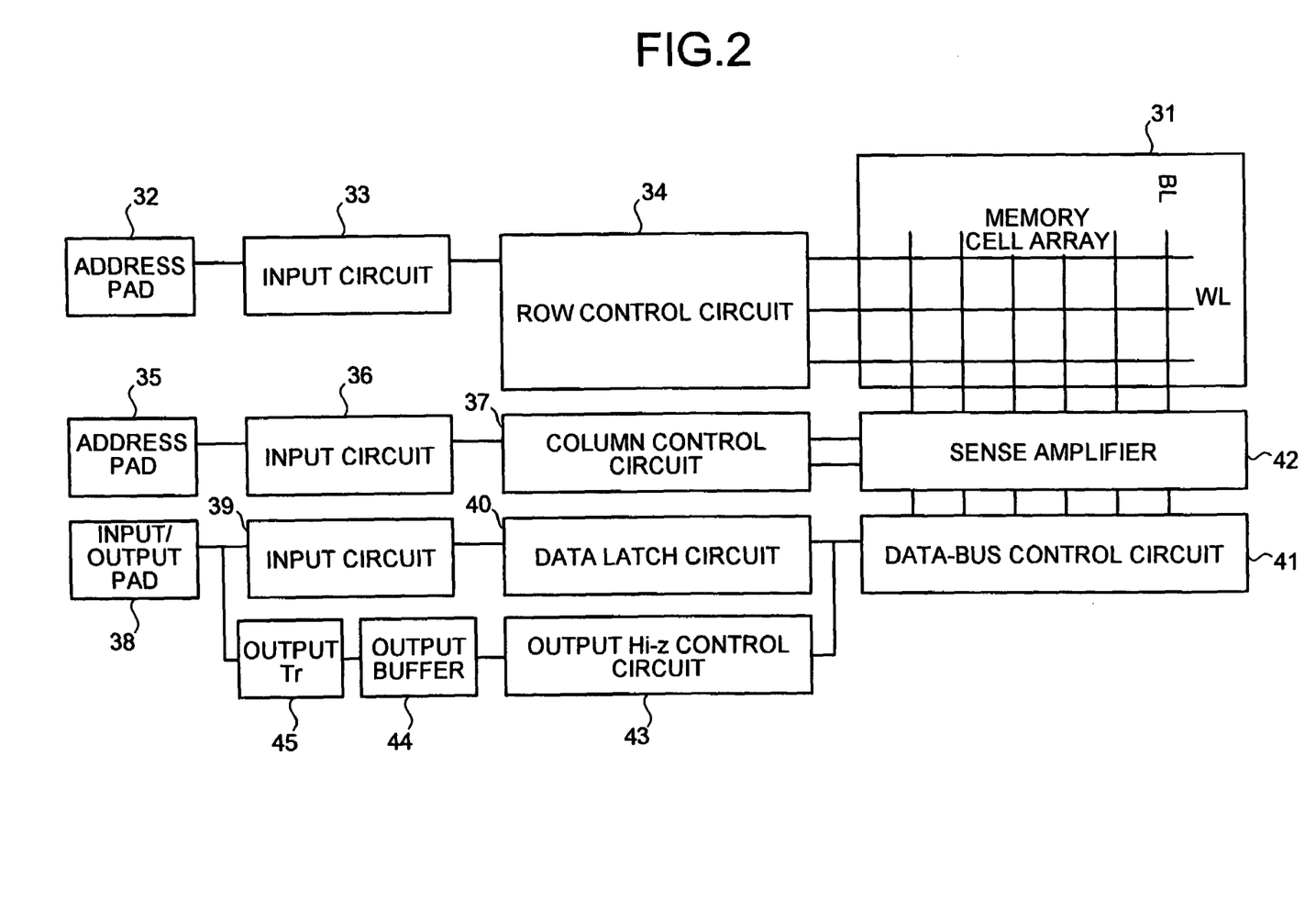
FIG. 2 is a block diagram of a semiconductor memory according to a first embodiment of the present invention.

FIG. 2 is a block diagram of a semiconductor memory according to a first embodiment of the present invention. Reference numeral 31 denotes a memory cell array. Row address data input from an address pad 32 is transmitted to a row control circuit 34 through an input circuit 33. The row control circuit 34 selects a word line WL corresponding to the row address data input. Column address data input from an address pad 35 is transmitted to a column control circuit 37 through an input circuit 36. The column control circuit 37 selects a bit line BL corresponding to the column address data input.

Write data is input from an input/output pad 38 (hereinafter, "pad") and transmitted to a data-bus control circuit 41 through an input circuit 39 and a data latch circuit 40. The data-bus control circuit 41 writes the write data in a memory cell selected with the word line WL and the bit line BL. On the other hand, data is read by a sense amplifier 42 from a memory cell selected by a word line WL and a bit line BL. The data-bus control circuit 41 transmits the read data to the pad 38 through an output buffer circuit 44 and an output transistor (Tr) 45.

By changing the input data into various patterns, interference between bit lines connected to cells and conditions between storage (capacitor) of cells can be measured in the test. The test is performed in a DQ-compression test mode so as to increase the number of such measurements. For example, data of 32 pads 38 can be compressed into data represented by four pads (a plurality of pads 38 are shown as one block in FIG. 2). Thus, probe pins of a testing device only have to contact four pads. The number of pads is not limited to this example.

An output-high-impedance (Hi-z) control circuit 43 outputs a coincidence signal when the write data and the read data coincide, and a non-coincidence signal when they do not coincide. Either signal is transmitted to the pad 38 through the output buffer circuit 44 and the output transistor (Tr) 45, to be read from outside.

Figure 3:
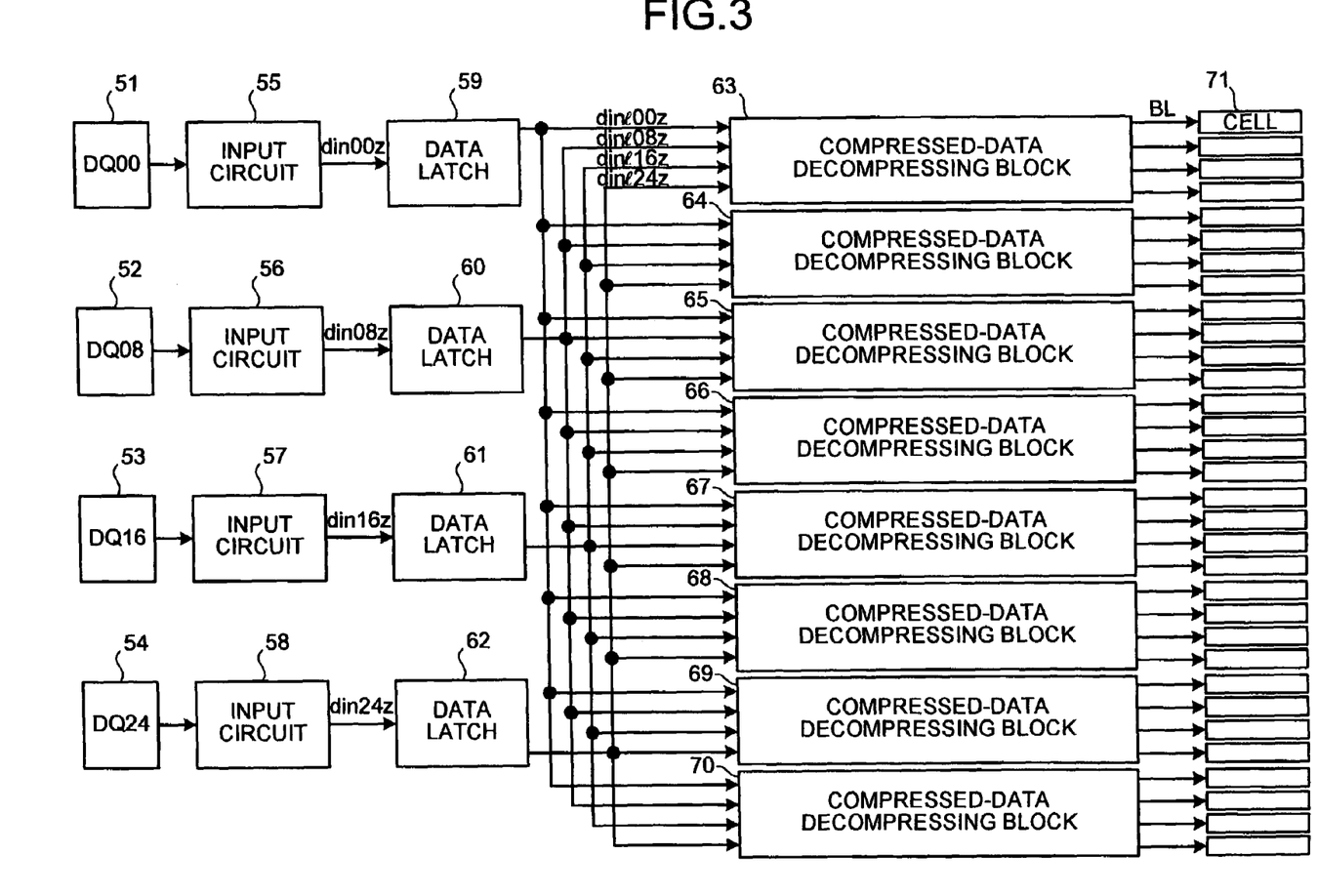
FIG. 3 is a block diagram for explaining the flow of the data when writing the data in the DQ-compression test mode.

FIG. 3 is a block diagram for explaining the flow of the data when writing the data in the DQ-compression test mode. From among the 32 pads, it is assumed that four pads are used for input and output of data in this example. These four pads are hereinafter called "representative pads". Among the 32 pads, the first pad (DQ00), the ninth pad (DQ08), the seventeenth pad (DQ16), and the twenty-fifth pad (DQ24) correspond to a first representative pad (DQ00) 51, a second representative pad (DQ08) 52, a third representative pad (DQ16) 53, and a fourth representative pad (DQ24) 54, respectively.

Write data is input to input circuits 55, 56, 57, and 58 through the first to fourth representative pads (DQ00, DQ08, DQ16, and DQ24) 51, 52, 53, and 54, respectively. Then, input data din00z in the first input circuit 55, input data din08z in the second input circuit 56, input data din16z in the third input circuit 57, and input data din24z in the fourth input circuit 58 are latched in data latch circuits 59, 60, 61, and 62, respectively. Data din00z latched in the first data latch circuit 59, data din08z latched in the second data latch circuit 60, data din16z latched in the third data latch circuit 61, and data din24z latched in the fourth data latch circuit 62 are transmitted to, for example, eight compressed-data decompressing blocks 63, 64, 65, 66, 67, 68, 69, and 70.

Each of the compressed-data decompressing blocks 63 to 70 decompress the four data din00z, din08z, din16z, and din24z to four data buses connected to different bit lines BL, respectively. As a result, the data input to the four representative pads (DQ00, DQ08, DQ16, and DQ24) 51, 52, 53, and 54 are decompressed into 32 data buses connected to different bit lines BL, and then written into 32 memory cells 71 that are connected to each bit line BL.

The input circuits 55 to 58 and the data latch circuits 59 to 62 correspond to the input circuit 39 and the data latch circuit 40 in FIG. 2. Numbers of the representative pads, the compressed-data decompressing blocks, and the data buses are determined according to the total number of pads in a semiconductor memory.

Generally, the same test pattern is repeated for every four pads. In the first embodiment, the data input to the first representative pad (DQ00) 51 is decompressed to the first pad (DQ00), the fifth pad (DQ04), the ninth pad (DQ08), the thirteenth pad (DQ12), the seventeenth pad (DQ16), the twenty-first pad (DQ20), the twenty-fifth pad (DQ24), and the twenty-ninth pad (DQ28). The data input to the second representative pad (DQ08) 52 is decompressed to the second pad (DQ01), the sixth pad (DQ05), the tenth pad (DQ09), the fourteenth pad (DQ13), the eighteenth pad (DQ17), the twenty-second pad (DQ21), the twenty-sixth pad (DQ25), and the thirtieth pad (DQ29).

The data input to the third representative pad (DQ16) 53 is decompressed to the third pad (DQ02), the seventh pad (DQ06), the eleventh pad (DQ10), the fifteenth pad (DQ14), the nineteenth pad (DQ18), the twenty-third pad (DQ22), the twenty-seventh pad (DQ26), and the thirty-first pad (DQ30). The data input to the fourth representative pad (DQ24) 54 is decompressed to the fourth pad (DQ03), the eighth pad (DQ07), the twelfth pad (DQ11), the sixteenth pad (DQ15), the twentieth pad (DQ19), the twenty-fourth pad (DQ23), the twenty-eighth pad (DQ27), and the thirty-second pad (DQ31).

Figure 4:
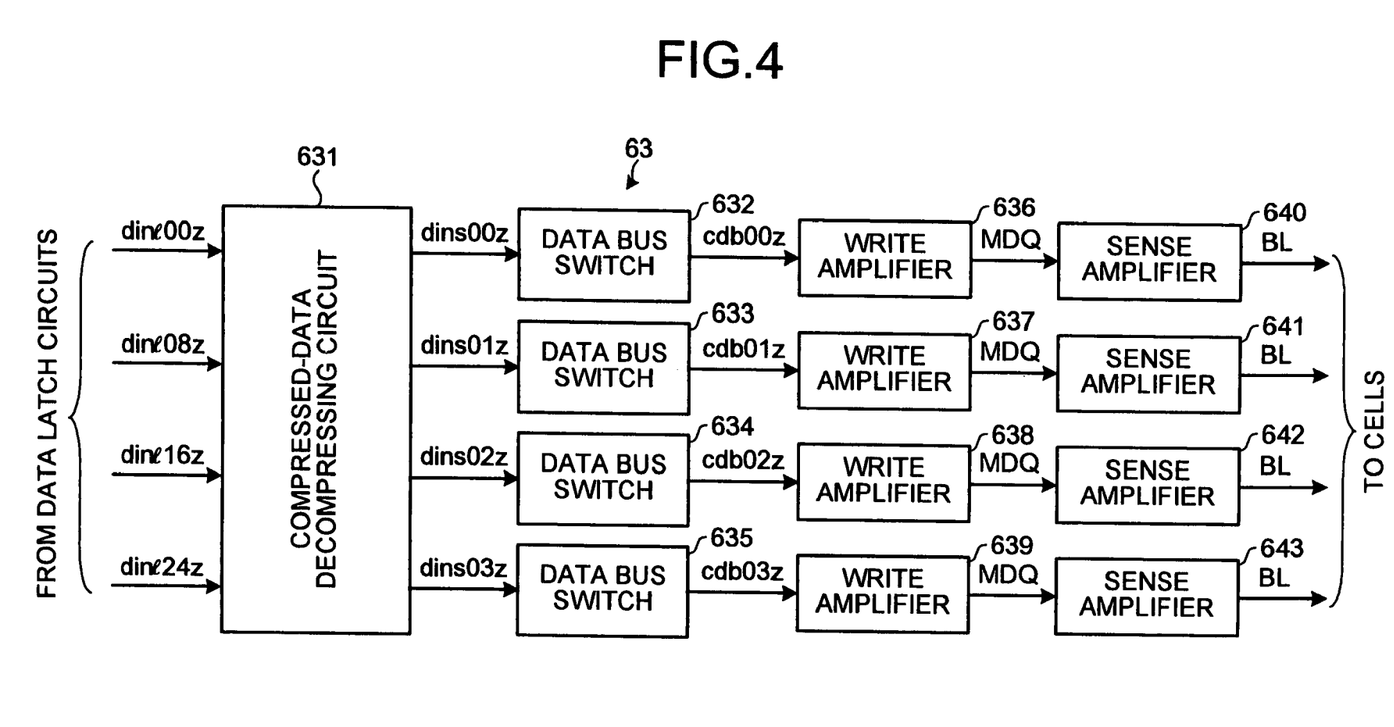
FIG. 4 is a block diagram for explaining the flow of the data in a compressed-data decompressing block shown in FIG. 3.

FIG. 4 is a block diagram for explaining the flow of the data in a compressed-data decompressing block shown in FIG. 3. The eight compressed-data decompressing blocks all have the same configuration, so the first compressed-data decompressing block 63 is described below. The first compressed-data decompressing block 63 decompresses the data input to four data, corresponding to the first pad (DQ00), the second pad (DQ01), the third pad (DQ02), and the fourth pad (DQ03).

The first compressed-data decompressing block 63 includes a compressed-data decompressing circuit 631, data bus switches 632, 633, 634, and 635, write amplifiers 636, 637, 638, and 639, and sense amplifiers 640, 641, 642, and 643. The data bus switches 632 to 635, the write amplifiers 636 to 639, and the sense amplifiers 640 to 643 do not actually decompress the compressed data. However, for the sake of convenience, they are included in the compressed-data decompressing block 63. The compressed-data decompressing circuit 631, the data bus switches 632 to 635, and the write amplifiers 636 to 639 are included in the data-bus control circuit 41 shown in FIG. 2. The sense amplifiers 640 to 643 are included in the sense amplifier 42 shown in FIG. 2.

The compressed-data decompressing circuit 631 receives the four data din00z, din08z, din16z and din24z transmitted from the data latch circuits 59 to 62, and decompresses them as first data dins00z, second data dins01z, third data dins02z, and fourth data dins03z, respectively. The decompressed data dins00z to dins03z are written into corresponding cells through the write amplifiers 636 to 639, and the sense amplifies 640 to 643, respectively.

The second compressed-data decompressing block 64 decompresses the data received as fifth data dins04z, sixth data dins05z, seventh data dins06z, and eighth data dins07z. The third compressed-data decompressing block 65 decompresses the data received as ninth data dins08z, tenth data dins09z, eleventh data dins10z, and twelfth data dins11z. The fourth compressed-data decompressing block 66 decompresses the data received as thirteenth data dins12z, fourteenth data dins13z, fifteenth data dins14z, and sixteenth data dins15z.

The fifth compressed-data decompressing block 67 decompresses the data received as seventeenth data dins16z, eighteenth data dins17z, nineteenth data dins18z, and twentieth data dins19z. The sixth compressed-data decompressing block 68 decompresses the data received as twenty-first data dins20z, twenty-second data dins21z, twenty-third data dins22z, and twenty-fourth data dins23z. The seventh compressed-data decompressing block 69 decompresses the data received as twenty-fifth data dins24z, twenty-sixth data dins25z, twenty-seventh data dins26z, and twenty-eighth data dins27z.

Figure 5:
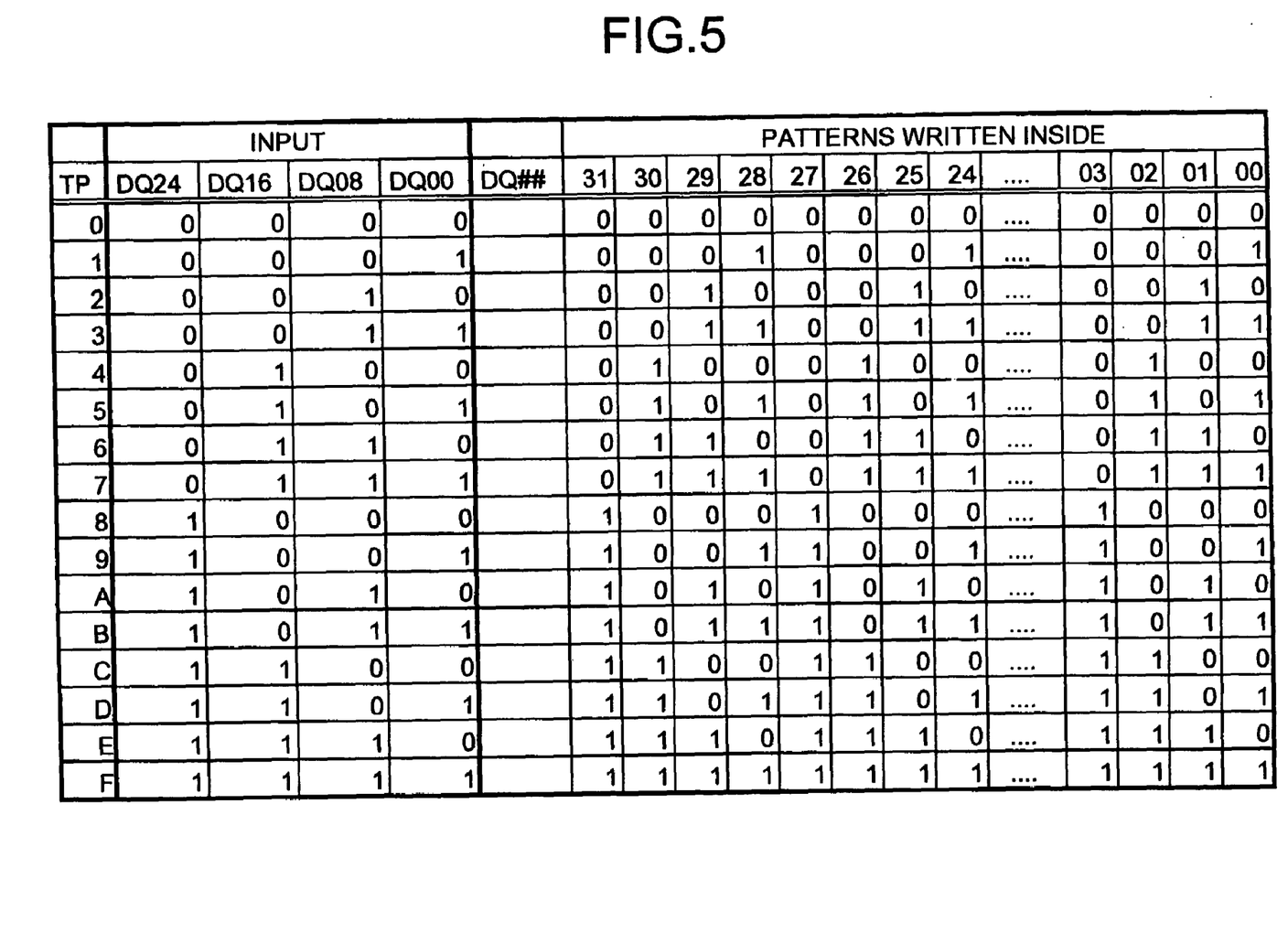
FIG. 5 is a table of examples of decompressed data patterns.

The eighth compressed-data decompressing block 70 decompresses the data received as twenty-ninth data dins28z, thirtieth data dins29z, thirty-first data dins30z, and thirty-second data dins31z. With this configuration, the test pattern for all 32 pads (DQ00 to DQ31) can be dynamically changed, only by changing the data input to the first representative pad (DQ00) 51, the second representative pad (DQ08) 52, the third representative pad (DQ16) 53, and the fourth representative pad (DQ24) 54. FIG. 5 is a table of 16 test patterns, in which four data are decompressed to 32 data. There can be any number of test patterns.

Figure 6:
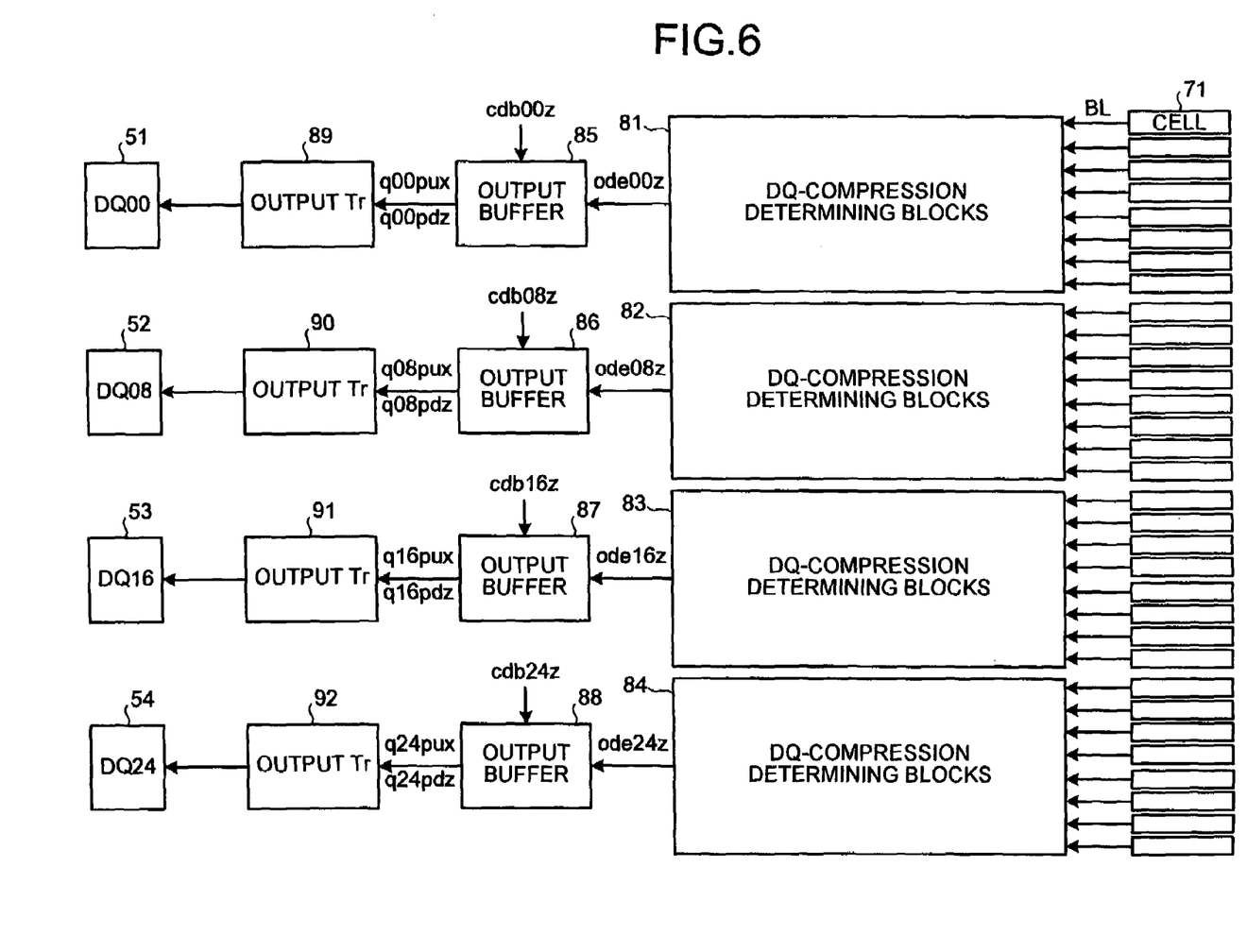
FIG. 6 is a block diagram for explaining the flow of the data when reading the data in the DQ-compression test mode.

FIG. 6 is a block diagram for explaining the flow of the data when reading the data in the DQ-compression test mode. In this example, there are four DQ-compression determining blocks 81, 82, 83, and 84. The data is read from the 32 cells, and eight data is provided to each of the DQ-compression determining blocks. The DQ-compression determining block determines whether the eight data provided coincide with the eight data that was initially written into the corresponding cells.

The results of determination by the DQ-compression determining blocks 81 to 84 are output to the first representative pad (DQ00) 51, the second representative pad (DQ08) 52, the third representative pad (DQ16) 53, and the fourth representative pad (DQ24) 54 through output buffers 85, 86, 87, and 88, and output transistors (Tr) 89, 90, 91, and 92, respectively. The output buffers 85 to 88, and the output transistors (Tr) 89 to 92 are included in the output buffer circuit 44 and the output transistor (Tr) 45 in FIG. 2, respectively.

Figure 7:
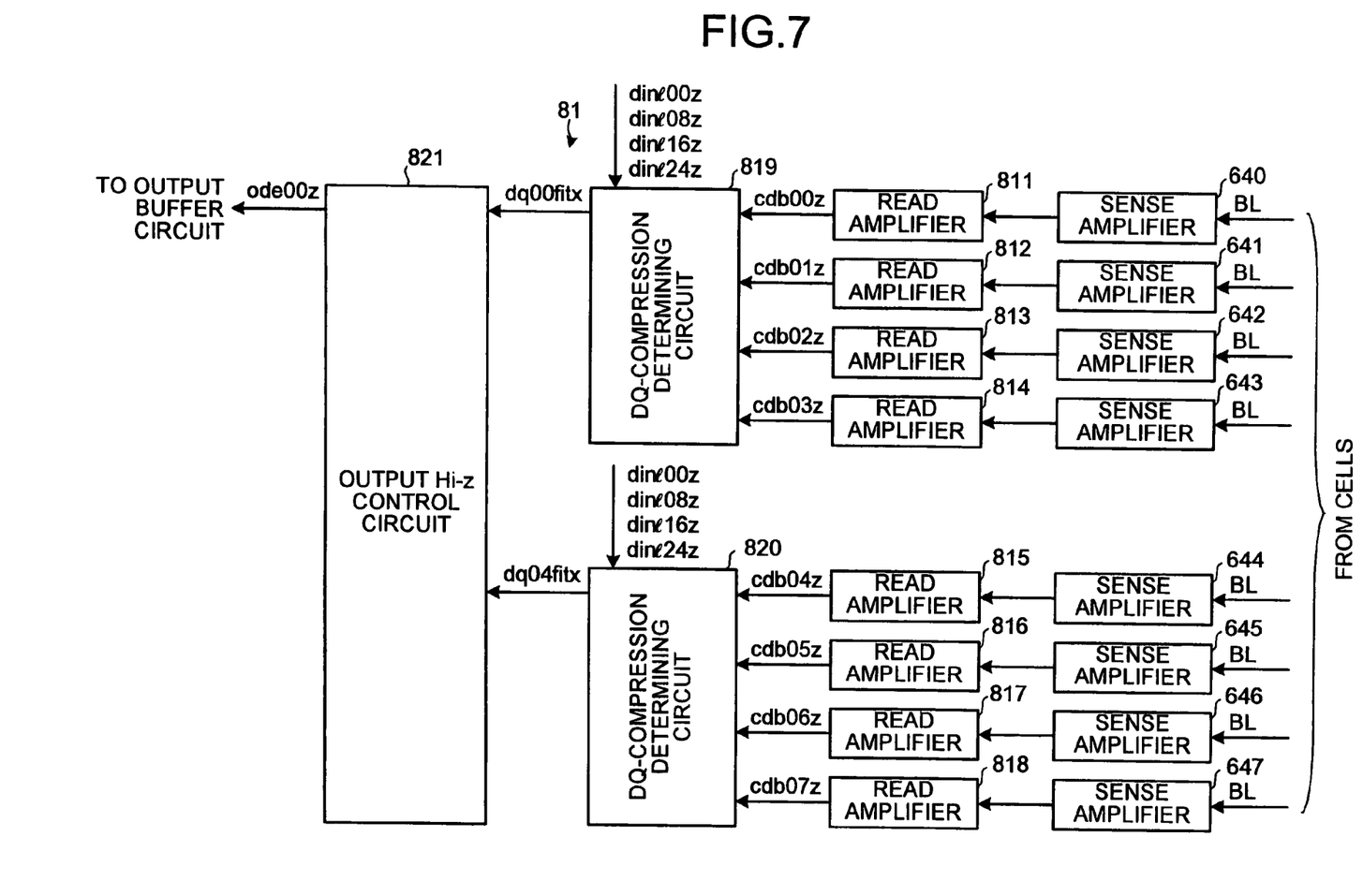
FIG. 7 is a block diagram for explaining the flow of the data in a DQ-compression determining block shown in FIG. 6.

FIG. 7 is a block diagram for explaining the flow of the data in a DQ-compression determining block shown in FIG. 6. The four DQ-compression determining blocks all have the same configuration, so the first DQ-compression determining block 81 is described below. The data in the cells corresponding to the first to eighth pads (DQ00 to DQ07) are input to the first DQ-compression determining block 81.

The first DQ-compression determining block 81 includes the sense amplifiers 640, 641, 642, 643, 644, 645, 646, and 647, read amplifiers 811, 812, 813, 814, 815, 816, 817, and 818, DQ-compression determining circuits 819 and 820, and an output-high-impedance (Hi-z) control circuit 821. The sense amplifiers 640 to 647 and the read amplifiers 811 to 818 do not actually determine the compression. However, for the sake of convenience, they are included in the DQ-compression determining block 81.

The sense amplifiers 644 to 647 are included in the sense amplifier 42 in FIG. 2. The read amplifiers 811 to 818 and the DQ-compression determining circuits 819 and 820 are included in the data-bus control circuit 41 in FIG. 2. The output-high-impedance (Hi-z) control circuit 821 is included in the output-high-impedance (Hi-z) control circuit 43 in FIG. 2.

The four data corresponding to the first to fourth pads (DQ00 to DQ03) are input to the first DQ-compression determining block 81. The data is then input to one DQ-compression determining circuit 819, through the sense amplifiers 640 to 643 and the read amplifiers 811 to 814, as read data. The DQ-compression determining circuit 819 compares the four read data cdb00z, cdb01z, cdb02z, and cdb03z, with the four write data dinl00z, dinl08z, dinl16z, and dinl24z that were initially input from the first to fourth representative pads (DQ00, DQ08, DQ16, and DQ24).

If the read data cdb00z to cdb03z coincides with the write data dinl00z to dinl24z, a coincidence signal dq00*fitx* is output (asserted). If any one of the four pairs of data do not coincide, a non-coincidence signal is output (i.e., coincidence signal dq00*fitx* is negated).

The four data corresponding to the fifth to eighth pads (DQ04 to DQ07) are input to the first DQ-compression determining block 81. The data is then input to the other DQ-compression determining circuit 820, through the sense amplifiers 644 to 647 and the read amplifiers 815 to 818, as read data. If the four read data cdb04z, cdb05z, cdb06z, and cdb07z coincide with the four write data dinl00z, dinl08z, dinl16z, and dinl24z, the DQ-compression determining circuit 820 outputs (asserts) a coincidence signal dq04*fitx*. If not, a non-coincidence signal is output (i.e., coincidence signal dq04*fitx* is negated).

The signals dq00*fitx* and dq04*fitx* output from DQ-compression determining circuits 819 and 820, respectively, are input to the output-high-impedance (Hi-z) control circuit 821. If both signals dq00*fitx* and dq04*fitx* are asserted, an output signal ode00z from the output-high-impedance (Hi-z) control circuit 821 is H level. The signal ode00z of H level is transmitted through the output buffer 85 and the output transistor 89, to the first representative pad (DQ00) 51 (not shown). As a result, the first representative pad (DQ00) 51 becomes low impedance (Low-z).

On the other hand, if either one or both of the signals dq00*fitx* and dq04*fitx* are negated, the signal ode00z is L level. The signal ode00z of L level is transmitted through the output buffer 85 and the output transistor (Tr) 89, to the first representative pad (DQ00) (in FIG. 2). As a result, the first representative pad (DQ00) 51 becomes high impedance (Hi-z).

The second DQ-compression determining block 82 compares the read data corresponding to the ninth to sixteenth pads (DQ08 to DQ15) with the write data dinl00z, dinl08z, dinl16z, and dinl24z. The third DQ-compression determining block 83 compares the read data corresponding to the seventeenth to twenty-fourth pads (DQ16 to DQ23) with the write data dinl00z, dinl08z, dinl16z, and dinl24z.

The fourth DQ-compression determining block 84 compares the read data corresponding to the twenty-fifth to thirty-second pads (DQ24 to DQ31) with the write data dinl00z, dinl08z, dinl16z, and dinl24z. Accordingly, the test results can be read from the four representative pads (DQ00, DQ 08, DQ 16, and DQ24) 51, 52, 53, and 54, by comparing the read data and the write data.

According to the first embodiment, it is possible to dynamically change the data input in the four representative pads (DQ00, DQ 08, DQ 16, and DQ24) 51, 52, 53, and 54, each of which contacting a probe pin of the testing device. Therefore, the electric potential of a selected bit line BL, and that of the storage (capacitor) of a cell connected to the selected bit line BL, can be changed arbitrarily between H and L levels, without changing a test code. Therefore, time and cost required to perform a test in the DQ-compression test mode can be reduced.

A second embodiment according to the present invention is configured to perform a test in the DQ-compression test mode for a semiconductor memory that has a plurality of memory banks. Here, an address data to select a bank is degenerated, so that the address data is written in two banks at once, or read from two banks at once.

Figure 8:
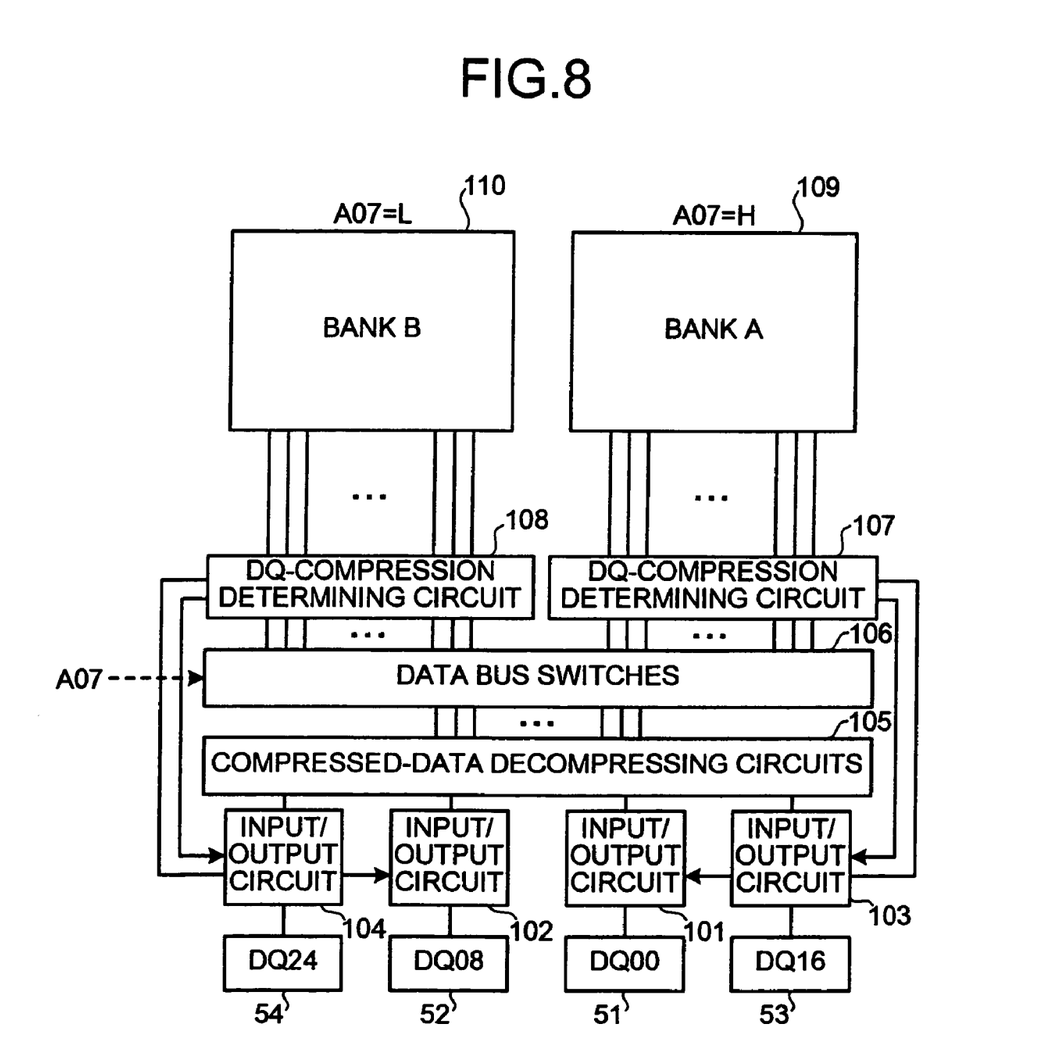
FIG. 8 is a block diagram of a semiconductor memory according to a second embodiment of the present invention.

FIG. 8 is a block diagram of a semiconductor memory according to the second embodiment of the present invention. The first, second, third, and fourth representative pads (DQ00, DQ08, DQ16, and DQ24) 51, 52, 53, and 54 are connected to input/output circuits 101, 102, 103, and 104. The input/output circuits 101, 102, 103, and 104 connected to a group of compressed-data decompressing circuits 105.

The group of compressed-data decompressing circuits 105 is connected to a group of data bus switches 106 by 32 data buses. The group of data bus switches 106 is connected to two groups of DQ-compression determining circuits 107 and 108, by 32 data buses, respectively. There are two banks A 109 and B 110. The group of DQ-compression determining circuits 107 is connected to the bank A 109 by 32 data buses. The group of DQ-compression determining circuits 107 is also connected to the input/output circuits 101 and 103, which are connected to the first and third representative pads (DQ00, DQ16) 51, 53, respectively.

The other group of DQ-compression determining circuits 108 is connected to the other bank B 110 by 32 data buses. The group of DQ-compression determining circuits 108 is also connected to the input/output circuits 102 and 104, which are connected to the second and fourth representative pads (DQ08, DQ24) 52, 54, respectively. There can be any number of data buses in this configuration. Under normal operation, a bank is selected by a certain address, for example A07. Then, bank A 109 is selected if the address data is H level, and bank B 110 is selected if it is L level.

The components of the second embodiment correspond to those of the first embodiment, as follows. The input/output circuits 101 to 104 correspond to: the input circuits 39 in FIGS. 2 and 55 to 58 in FIG. 3; the data latch circuits 40 in FIGS. 2 and 59 to 62 in FIG. 3; the output buffer circuits 44 in FIGS. 2 and 85 to 88 in FIG. 6; and the output transistors (Tr) 45 in FIGS. 2 and 89 to 92 in FIG. 6. The group of compressed-data decompressing circuits 105 corresponds to the compressed-data decompressing blocks 63 to 70 in FIG. 3. The group of data bus switches 106 corresponds to the data bus switches 632 to 635 in FIG. 4. The groups of DQ-compression determining circuits 107 and 108 each correspond to the DQ-compression determining blocks 81 to 84 in FIG. 6. Because the second embodiment includes two memory banks, there are two sets of the DQ-compression determining blocks 81 to 84.

When data is written in the DQ-compression test mode, the address data of A07 is degenerated before selecting either bank A 109 or bank B 110. Similarly to the first embodiment, the data A07 is input from the four representative pads (DQ00, DQ08, DQ16, and DQ24) 51, 52, 53, and 54. Then, the data A07 is decompressed into data of 32 bits by the group of compressed-data decompressing circuits 105, and written in both the bank A109 and the bank B110. Thus, the number of bits of the data in the bank A109 and the bank B110 added together is 64 bits (=32 bits×2).

When the data is read, it is determined whether the write data and the read data coincide, as in the first embodiment. In the first embodiment, the read data of 32 bits is compressed by every 8 bits (8DQ compression), so that the data is divided into four groups before the determination is made. However, in the second embodiment, the read data of 64 bits (32 bits of bank A 109+32 bits of bank B 110) is to be divided into four groups. Therefore, the 64 bits is compressed by every 16 bits (16DQ compression) in the groups of DQ-compression determining circuits 107 and 108.

The group of DQ-compression determining circuits 107 makes the coincidence/non-coincidence determination for the data of 32 bits in bank A 109. The other group of DQ-compression determining circuits 108 makes the coincidence/non-coincidence determination for the data of 32 bits in bank B 110.

The results of coincidence/non-coincidence for the data in bank A 109, corresponding to the first to sixteenth pads (DQ00 to DQ15), are output to the first representative pad (DQ00) 51 through the input/output circuit 101. The results of coincidence/non-coincidence for the data in bank A 109, corresponding to the seventeenth to thirty-second pads (DQ16 to DQ31), are output to the third representative pad (DQ16) 53 through the input/output circuit 103.

The results of coincidence/non-coincidence for the data written in bank B 110, corresponding to the first to sixteenth pads (DQ00 to DQ15), are output to the second representative pad (DQ08) 52 through the input/output circuit 102. The results of coincidence/non-coincidence for the data written in bank B 110, corresponding to the seventeenth to thirty-second pads (DQ16 to DQ31), are output to the fourth representative pad (DQ24) 54 through the input/output circuit 104.

If the data of 16 bits completely coincide, the representative pads (DQ00, DQ08, DQ16, and DQ24) 51, 52, 53, and 54 become low impedance (Low-z), and if any one bit does not coincide, the representative pads (DQ00, DQ08, DQ16, and DQ24) 51, 52, 53, and 54 become high impedance (Hi-z). In other words, the result of determination for bank A 109 is output to the first and third representative pads (DQ00, DQ16) 51, 53, and that of bank B 110 is output to the second and fourth representative pads (DQ08, DQ24) 52, 54. Therefore, it can be determined whether an error bit exists in either the bank A 109 or bank B 110, by performing the test. Then, the word line WL connected to the error bit is cut off, and a word line WL of a redundancy circuit is connected instead.

In conventional semiconductor devices including a plurality of memory banks, data has to be read from one bank at a time. However, in the second embodiment, data is written in or read from two banks at once, so that the reading process is halved. Therefore, the time and cost required for testing in the DQ-compression test mode can be reduced.

The present invention can have any number of pads or memory banks, provided that the configuration is such that: probe pins of a testing device only contact a certain number of pads among of a plurality of pads; some pads are grouped together; and data is compressed and decompressed within each group.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor device including a memory cell array wherein a plurality of bit lines intersect a plurality of word lines, a memory cell being provided at each intersection of the bit lines and the word lines, and data is written in or read from a memory cell by selecting an appropriate bit line and an appropriate word line, comprising:
- a plurality of pads to input or output data;
- a plurality of representative pads selected from among the pads;
- a decompressing unit that distributes first data, which includes at least two signals that are different from each other, input to the plurality of representative pads to all of the plurality of pads; and
- a writing unit that writes the first data in corresponding memory cells.

2. The semiconductor device according to claim 1, wherein the decompressing unit has a plurality of decompressing blocks, and the each of the plurality of decompressing blocks receives signal from each of the plurality of representative pads.

3. The semiconductor device according to claim 1, further comprising:
- a plurality of the data latch circuit, wherein each of the plurality of the data latch circuits receives data form the corresponding representative pad.

4. The semiconductor device according to claim 1, wherein the decompressing unit distributes the at least two signals to the adjacent pads.

5. A semiconductor device including a memory cell array wherein a plurality of bit lines intersect a plurality of word lines, a memory cell being provided at each intersection of the bit lines and the word lines, and data is written in or read from a memory cell by selecting an appropriate bit line and an appropriate word line, comprising:
- a plurality of pads to input or output data;
- a plurality of representative pads selected from among the pads;
- a reading unit that reads data from the memory cells, the data including at least two signals that are different from each other;
- a determining unit that divides the data read corresponding to all of the pads into number of groups corresponding to number of the representative pads, and determines whether the data in each group coincide with data previously written in the memory cells via the representative pads; and
- an output control unit that controls output to the representative pads based on a result of determination obtained by the determining unit.

6. The semiconductor device according to claim 5, wherein the determining unit outputs to the output control unit a coincidence signal if the data in each group coincide with the data previously written in the memory cells via the representative pads, and outputs a non-coincidence signal if the data in each group does not coincide with the data previously written in the memory cells via the representative pads.

7. The semiconductor device according to claim 6, wherein the determining units includes a plurality of determining blocks, wherein the output control unit outputs an H level signal if signals output from the plurality of determining blocks are all the coincidence signals, and outputs an L level signal if at least one of the plurality of determining blocks outputs the non-coincidence signal and, wherein the corresponding representative pad becomes low impedance if the output control unit outputs an H level signal, or becomes high impedance if the output control unit outputs an L level signal.

8. A semiconductor device including a memory cell array wherein a plurality of bit lines intersect a plurality of word lines, a memory cell being provided at each intersection of the bit lines and the word lines, and data is written in or read from a memory cell by selecting an appropriate bit line and an appropriate word line, comprising:
- a plurality of pads to input or output data;
- a plurality of representative pads selected from among the pads;
- a decompressing unit that distributes first data, which includes at least two signals that are different from each other, input to the plurality of representative pads to all of the plurality of pads;
- a writing unit that writes the first data in corresponding memory cells;
- a reading unit that reads the data from the memory cells written by the writing unit;
- a determining unit that divides the data read corresponding to all of the pads into number of groups corresponding to number of the representative pads, and determines whether the data in each group coincide with the data previously written in the memory cells via the representative pads; and
- an output control unit that controls output to the representative pads based on a result of determination obtained by the determining unit.

9. The semiconductor device according to claim 8, wherein the determining unit outputs to the output control unit a coincidence signal if the data in each group coincide with the data previously written in the memory cells via the representative pads, and outputs a non-coincidence signal if the data in each group does not coincide with the data previously written in the memory cells via the representative pads.

10. The semiconductor device according to claim 9, wherein the determining units includes a plurality of determining blocks, wherein the output control unit outputs an H level signal if signals output from the plurality of determining blocks are all the coincidence signals, and outputs an L level signal if at least one of the plurality of determining blocks outputs the non-coincidence signal and, wherein the corresponding representative pad becomes low impedance if the output control unit outputs an H level signal, or becomes high impedance if the output control unit outputs an L level signal.

11. The semiconductor device according to claim 8, wherein the decompressing unit has a plurality of decompressing blocks, and the each of the plurality of decompressing blocks receives signal from each of the plurality of representative pads.

12. The semiconductor device according to claim 4, further comprising:
- a plurality of the data latch circuit, wherein each of the plurality of the data latch circuits receives data form the corresponding representative pad.

13. The semiconductor device according to claim 8, wherein the decompressing unit distributes the at least two signals to the adjacent pads.

14. A semiconductor device including a first memory bank and a second memory bank, each of the first memory bank and the second memory bank having a memory cell array that has a plurality of bit lines intersecting a plurality of word lines, and a memory cell provided at each intersection of the bit lines and the word lines wherein an address data selects a memory bank, an appropriate bit line and an appropriate word line selects a memory cell in the memory bank selected, and the address data is written in or read from the memory cell selected, comprising:
- a plurality of pads to input or output data;
- a plurality of representative pads selected from among the pads;

a decompressing unit that decompresses data input to the representative pads to data corresponding to all of the pads;

a writing unit that writes the data decompressed in corresponding memory cells in both the first memory bank and the second memory bank;

a reading unit that reads the data from the memory cells in both the first memory bank and the second memory bank;

a first determining unit that divides the data read from the memory cells in the first memory bank corresponding to all of the pads into number of groups corresponding to number of the representative pads, and determines whether the data in each group coincide with the data previously written in the memory cells via the representative pads;

a first output control unit that controls output to the representative pads based on a result of determination obtained by the first determining unit;

a second determining unit that divides the data read from the memory cells in the second memory bank corresponding to all of the pads into number of groups corresponding to number of the representative pads, and determines whether the data in each group coincide with the data previously written in the memory cells via the representative pads;

a second output control unit that controls output to the representative pads, other than the representative pads to which the result of the first determining unit is output, based on a result of determination obtained by the second determining unit.

15. The semiconductor device according to claim 14, wherein the first determining unit outputs to the first output control unit a coincidence signal if the data in each group in the first memory bank coincide with the data previously written in the memory cells via the representative pads, and outputs a non-coincidence signal if the data in each group in the first memory bank does not coincide with the data previously written in the memory cells via the representative pads; and wherein the second determining unit outputs to the second output control unit a coincidence signal if the data in each group in the second memory bank coincide with the data previously written in the memory cells via the representative pads, and outputs a non-coincidence signal if the data in each group in the second memory bank does not coincide with the data previously written in the memory cells via the representative pads.

16. The semiconductor device according to claim 15, wherein the first determining units includes a plurality of first determining blocks, wherein the first output control unit outputs an H level signal if signals output from the plurality of first determining blocks are all the coincidence signals, and outputs an L level signal if at least one of the plurality of first determining blocks outputs the non-coincidence signal, wherein the corresponding representative pad becomes low impedance if the first output control unit outputs an H level signal, or becomes high impedance if the first output control unit outputs an L level signal, wherein the second determining units includes a plurality of second determining blocks, the second output control unit outputs an H level signal if signals output from the plurality of second determining blocks are all the coincidence signals, and outputs an L level signal if at least one of the plurality of second determining blocks outputs the non- coincidence signal and, wherein the corresponding representative pad, other than the representative pad to which the result for the first memory bank is output, becomes low impedance if the second output control unit outputs an H level signal, or becomes high impedance if the second output control unit outputs an L level signal.

* * * * *